US012569929B2

(12) United States Patent
Suzuki

(10) Patent No.: US 12,569,929 B2
(45) Date of Patent: Mar. 10, 2026

(54) WEDGE TOOL AND METHOD OF MANUFACTURING SEMICONDUCTOR DEVICE

(71) Applicant: Mitsubishi Electric Corporation, Tokyo (JP)

(72) Inventor: Erubi Suzuki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 24 days.

(21) Appl. No.: 18/577,842

(22) PCT Filed: Oct. 5, 2021

(86) PCT No.: PCT/JP2021/036809
§ 371 (c)(1),
(2) Date: Jan. 9, 2024

(87) PCT Pub. No.: WO2023/058110
PCT Pub. Date: Apr. 13, 2023

(65) Prior Publication Data
US 2024/0335901 A1     Oct. 10, 2024

(51) Int. Cl.
*B23K 20/00*     (2006.01)
*B23K 20/10*     (2006.01)
*H10W 72/00*     (2026.01)

(52) U.S. Cl.
CPC ............ *B23K 20/10* (2013.01); *B23K 20/004* (2013.01); *H10W 72/07141* (2026.01); *H10W 72/07533* (2026.01)

(58) Field of Classification Search
CPC .......... B23K 20/10–106; B23K 20/004; B23K 20/005; B23K 20/007; H01L 24/78;
(Continued)

(56) References Cited

U.S. PATENT DOCUMENTS 11,007,602 B2 * 5/2021 Idota ...................... B23K 20/10
11,929,265 B2 * 3/2024 Yadani .................... H01L 24/80
(Continued)

FOREIGN PATENT DOCUMENTS

DE      11 2012 003 918 B4    10/2020
JP          H01-273328 A      11/1989
(Continued)

OTHER PUBLICATIONS

An Office Action; "Notice of Reasons for Refusal," mailed by the Japanese Patent Office on Dec. 3, 2024, which corresponds to Japanese Patent Application No. 2023-552434 and is related to U.S. Appl. No. 18/577,842.
(Continued)

*Primary Examiner* — Kiley S Stoner
(74) *Attorney, Agent, or Firm* — Studebaker Brackett PLLC

(57) ABSTRACT

A wedge tool according to one aspect of the present disclosure is a wedge tool used for wedge bonding of pressing a metal wire and applying ultrasonic vibration, thereby bonding the metal wire to a bonded body, including: a wire holding groove extending along a longitudinal direction of the metal wire in a tip end portion of the wedge tool and holding the metal wire; and at least two convex parts formed in a groove bottom part of the wire holding groove and having a side surface located away from a sidewall of the wire holding groove and arranged in the longitudinal direction of the metal wire.

19 Claims, 24 Drawing Sheets

(58) Field of Classification Search
CPC . H01L 2224/78315; H01L 2224/85205; H01L 2924/2076; H01L 24/85; B29C 65/08
USPC ........................... 228/1.1, 4.5, 110.1, 180.5; 156/73.1–73.6
See application file for complete search history.

(56) References Cited

U.S. PATENT DOCUMENTS

| | | | |
|---|---|---|---|
| 2014/0103095 A1 | 4/2014 | Walker | |
| 2019/0287940 A1* | 9/2019 | Delsman | B23K 26/40 |
| 2020/0395333 A1* | 12/2020 | Imai | B23K 20/005 |
| 2025/0125303 A1* | 4/2025 | Ownby | H01L 24/48 |

FOREIGN PATENT DOCUMENTS

| | | | | |
|---|---|---|---|---|
| JP | 2000058603 A | * | 2/2000 | H01L 24/78 |
| JP | 2000299347 A | * | 10/2000 | H01L 24/48 |
| JP | 2000351159 A | * | 12/2000 | B29C 66/7392 |
| JP | 2000357705 A | * | 12/2000 | H01L 24/48 |
| JP | 2011171676 A | * | 9/2011 | H01L 24/78 |
| JP | 2013166335 A | * | 8/2013 | B29C 65/08 |
| JP | 2014045161 A | * | 3/2014 | H01L 24/78 |
| JP | 2014116334 A | * | 6/2014 | H01L 24/78 |
| JP | 2015109376 A | * | 6/2015 | H01L 24/48 |
| JP | 6121741 B2 | * | 4/2017 | H01L 24/48 |
| KR | 20150086548 A | * | 7/2018 | |
| KR | 101970285 B1 | * | 4/2019 | |
| WO | WO-2010091222 A2 | * | 8/2010 | B23K 20/004 |
| WO | WO-2019155547 A1 | * | 8/2019 | B23K 20/005 |
| WO | WO-2023058110 A1 | * | 4/2023 | B23K 20/10 |

OTHER PUBLICATIONS

International Search Report issued in PCT/JP2021/036809; mailed Dec. 14, 2021.
An Office Action issued by the German Patent and Trademark Office on Oct. 30, 2025, which corresponds to German Patent Application No. 112021008319.8 and is related to U.S. Appl. No. 18/577,842; with English language translation.

* cited by examiner

F I G . 1
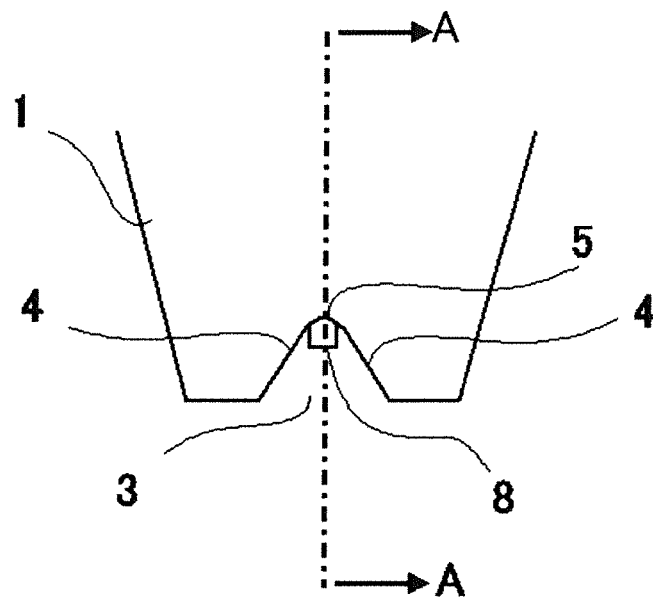

F I G.  2
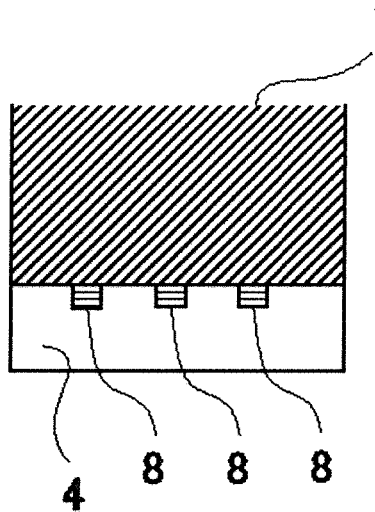

F I G . 3
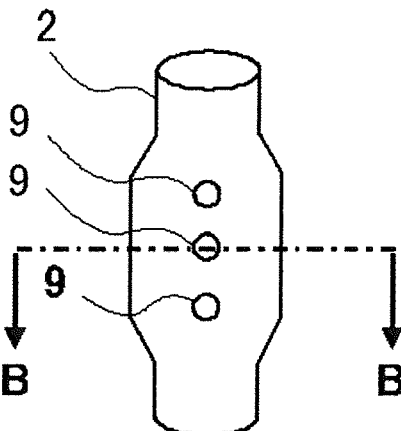

F I G.  4
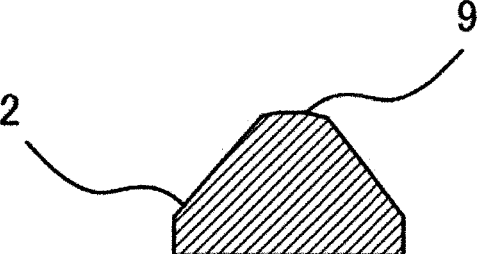

F I G. 5
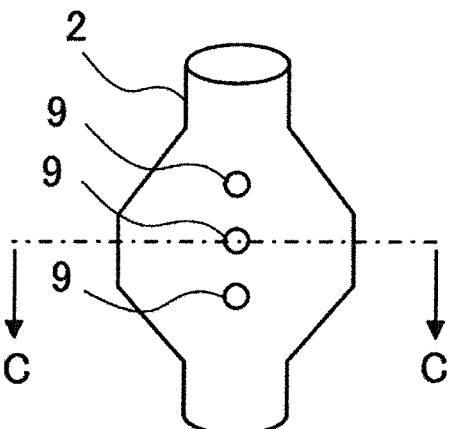

F I G. 6
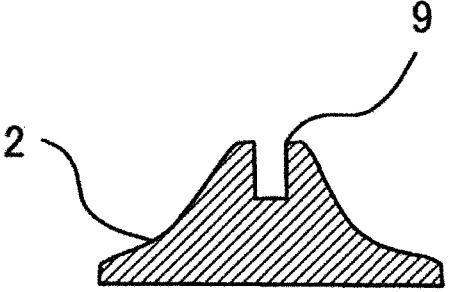

F I G.  7
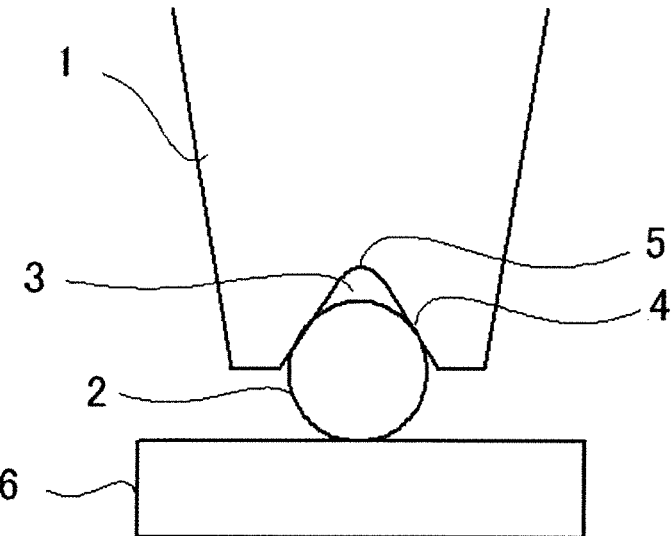

F I G.  8
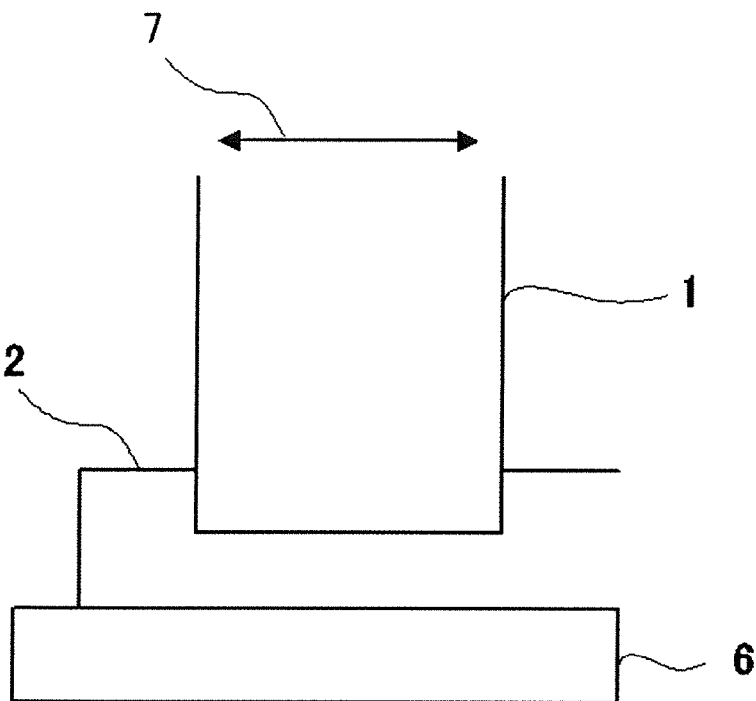

F I G. 9
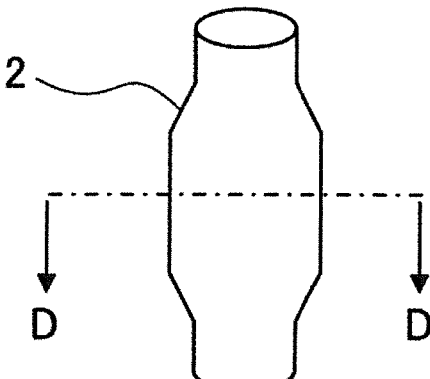

F I G.  1 0
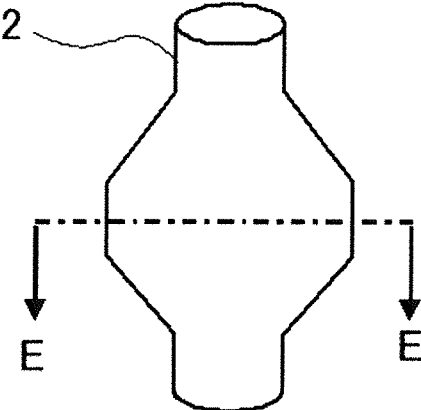

F I G.  1 1
2
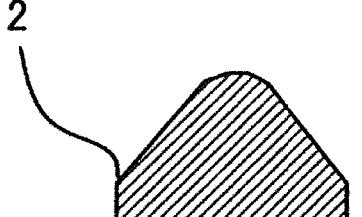

F I G. 1 2
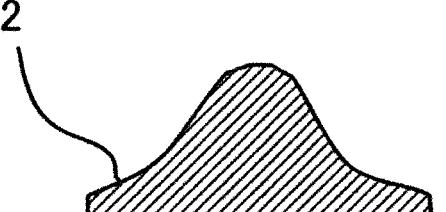

F I G.   1 3
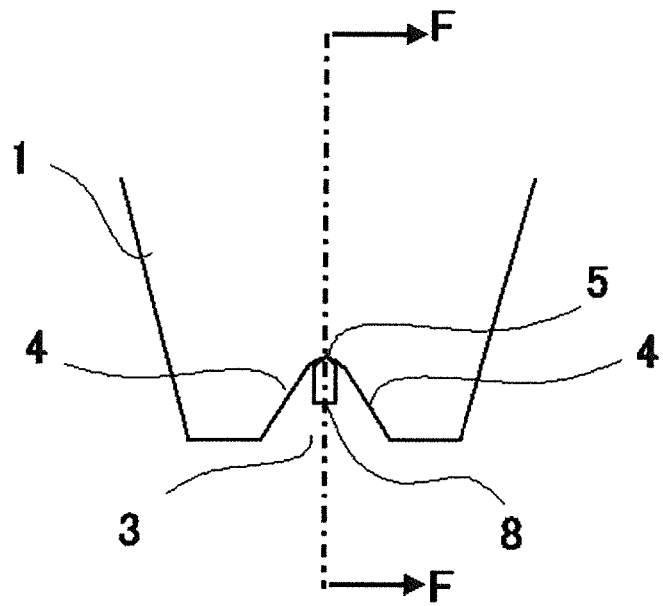

F I G.  1 4
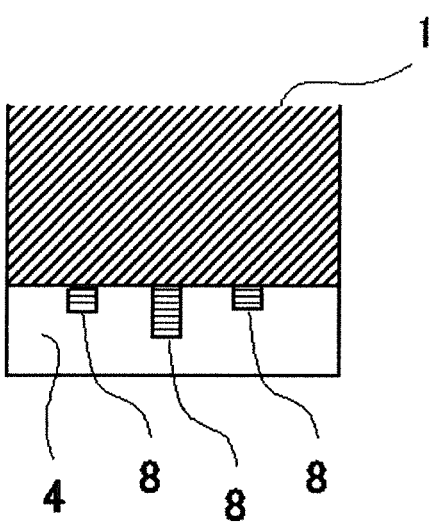

F I G.　1 5
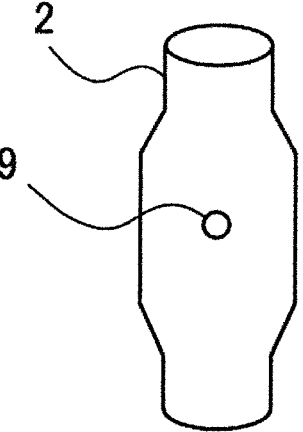

F I G.  1 6
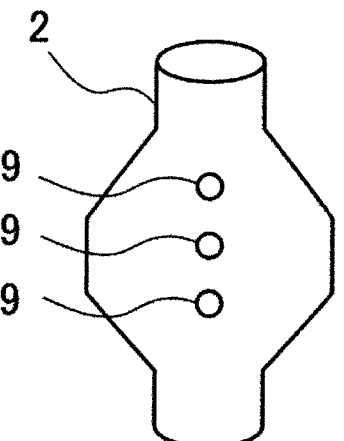

F I G.   1 7
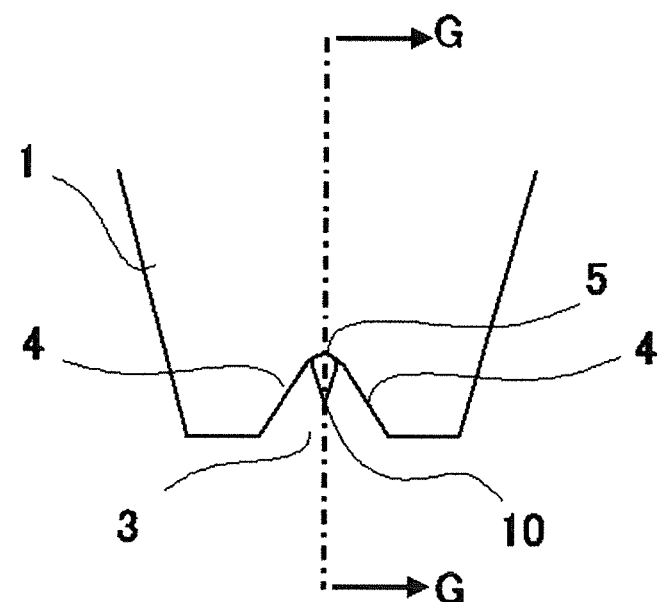

F I G.   1 8
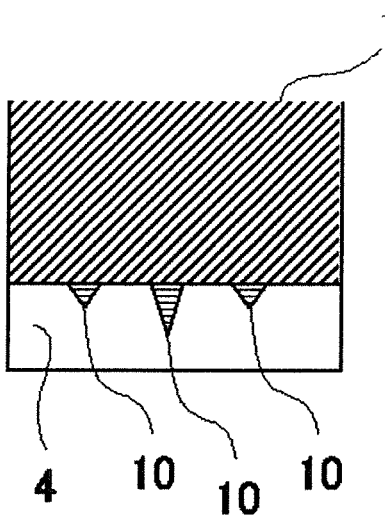

F I G.  1 9
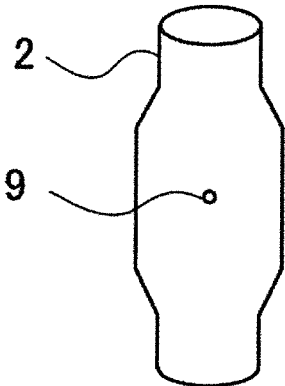

F I G.  2 0
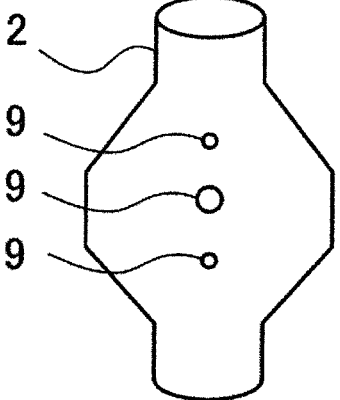

F I G.  2 1
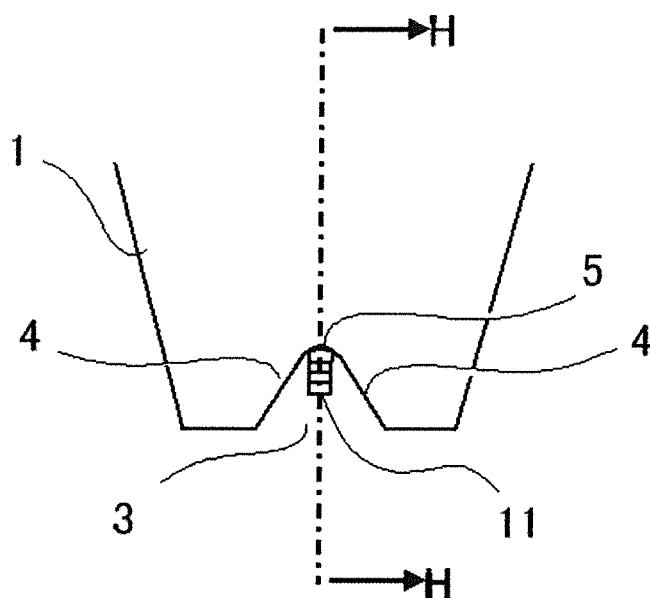

F I G.  2 2
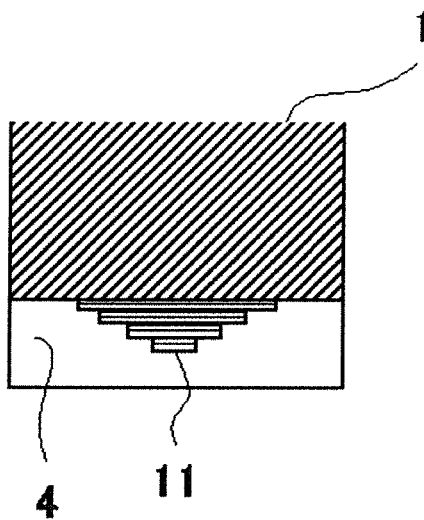

F I G.  2 3
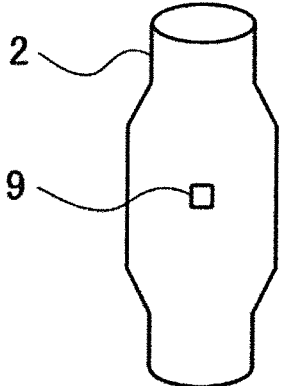

F I G.   2 4
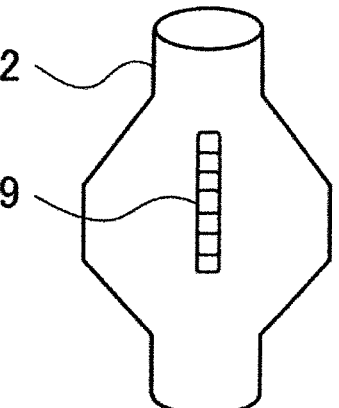

WEDGE TOOL AND METHOD OF MANUFACTURING SEMICONDUCTOR DEVICE

TECHNICAL FIELD

The present disclosure relates to a wedge tool and a method of manufacturing a semiconductor device.

BACKGROUND ART

Wedge bonding used for manufacturing a semiconductor device is a bonding method of pressing a metal wire to a bonded body with a wedge tool and applying ultrasonic vibration, thereby bonding the metal wire and the bonded body. Thus, disclosed as a conventional technique is a structure that convex parts disposed in a zigzag form are provided to a groove wall part of the wedge tool to suppress slip of the wedge tool and the metal wire and improve bonding properties.

PRIOR ART DOCUMENTS

Patent Document(s)

Patent Document 1: Japanese Patent Application Laid-Open No. 2014-116334

SUMMARY

Problem to be Solved by the Invention

In the conventional technique, the bonded body may be damaged when force of pressing the metal wire to the bonded body with the wedge tool is too large. Thus, an appearance inspection for a shape of the metal wire pressed and deformed by the wedge tool is performed to confirm whether excessive force is not applied to the bonded body by a non-destructive method.

In the meanwhile, an end portion of the metal wire pressed and deformed by the wedge tool does not always have the same thickness and shape, and moreover, an appearance thereof may be seen differently depending on a difference of light intensity in the inspection. Thus, such a method causes fluctuation of right or wrong determination even in a visual appearance inspection by an optical microscope or an appearance inspection using image recognition. That is to say, an appearance inspection using an appearance shape of a deformed metal wire as an index has a problem that it may lead to reduction inspection accuracy.

The present disclosure is to solve the above problems, and an object is to provide a wedge tool suppressing reduction of inspection accuracy compared with a conventional wedge tool by forming a contact mark in a metal wire by the wedge tool in pressing the metal wire with the wedge tool in wedge bonding of bonding the metal wire and a bonded body and performing an appearance inspection using the contact mark as an index indicating force of pressing the metal wire and a method of manufacturing a semiconductor device using this wedge tool.

Means to Solve the Problem

A wedge tool according to one aspect of the present disclosure is a wedge tool used for wedge bonding of pressing a metal wire and applying ultrasonic vibration, thereby bonding the metal wire to a bonded body, including:

a wire holding groove extending along a longitudinal direction of the metal wire in a tip end portion of the wedge tool and holding the metal wire; and at least two convex parts formed in a groove bottom part of the wire holding groove and each having a side surface located away from a sidewall of the wire holding groove and arranged in the longitudinal direction of the metal wire.

A wedge tool according to one aspect of the present disclosure is a wedge tool used for wedge bonding of pressing a metal wire and applying ultrasonic vibration, thereby bonding the metal wire to a bonded body, including: a wire holding groove extending along a longitudinal direction of the metal wire in a tip end portion of the wedge tool and holding the metal wire; and convex parts formed in a groove bottom part of the wire holding groove and having heights different from each other.

Furthermore, a method of manufacturing a semiconductor device according to one aspect of the present disclosure is a manufacturing method including: a step of pressing a metal wire to a bonded body using a wedge tool; a step of applying ultrasonic vibration while the metal wire is pressed; and a step of determining that press force on the bonded body is larger than predetermined force when a contact mark is formed in the metal wire by a convex part in the step of pressing the metal wire.

A method of manufacturing a semiconductor device according to one aspect of the present disclosure is a manufacturing method including: a step of pressing a metal wire to a bonded body using a wedge tool; a step of applying ultrasonic vibration while the metal wire is pressed; and a step of determining appropriateness of press force on the bonded body in accordance with a depth of a contact mark formed in the metal wire by a convex part in the step of pressing the metal wire.

A method of manufacturing a semiconductor device according to one aspect of the present disclosure is a manufacturing method including: a step of pressing a metal wire to a bonded body using a wedge tool; a step of applying ultrasonic vibration while the metal wire is pressed; and a step of determining appropriateness of press force on the bonded body in accordance with a total number of contact marks formed in the metal wire by a convex part in the step of pressing the metal wire.

A method of manufacturing a semiconductor device according to one aspect of the present disclosure is a manufacturing method including: a step of pressing a metal wire to a bonded body using a wedge tool; a step of applying ultrasonic vibration while the metal wire is pressed; and a step of determining appropriateness of press force on the bonded body in accordance with a length of a contact mark in a longitudinal direction of the metal wire formed in the metal wire by a convex part in the step of pressing the metal wire.

Effects of the Invention

According to the present disclosure, a metal wire is bonded to a bonded body by pressing the metal wire using a wedge tool and applying ultrasonic vibration, and when press force on the bonded body is larger than predetermined force, a contact mark is formed in the metal wire by a convex part formed in a groove bottom part of a wire holding groove. As a result, it can be confirmed whether excessive force is not applied to the bonded body not by an appearance shape of the metal wire which has been pressed and deformed but by inspecting the contact mark formed in the metal wire, thus reduction of inspection accuracy can be suppressed.

BRIEF DESCRIPTION OF DRAWINGS

FIG. 1 A front view of a tip end portion 1 of a wedge tool according to an embodiment 1.

FIG. 2 An A-A cross-sectional view of the tip end portion 1 of the wedge tool according to the embodiment 1.

FIG. 3 A schematic appearance view of a metal wire 2 which is appropriately pressed according to the embodiment 1.

FIG. 4 A schematic B-B cross-sectional view of the metal wire 2 which is appropriately pressed according to the embodiment 1.

FIG. 5 A schematic appearance view of the metal wire 2 which is excessively pressed according to the embodiment 1.

FIG. 6 A schematic C-C cross-sectional view of the metal wire 2 which is excessively pressed according to the embodiment 1.

FIG. 7 A front view of a tip end portion of a wedge tool according to a conventional technique.

FIG. 8 A side view of a tip end portion of a wedge tool according to a conventional technique.

FIG. 9 A schematic appearance view of a metal wire which is properly pressed in a conventional technique.

FIG. 10 A schematic appearance view of a metal wire which is excessively pressed in a conventional technique.

FIG. 11 A schematic D-D cross-sectional view of a metal wire which is properly pressed in a conventional technique.

FIG. 12 A schematic E-E cross-sectional view of a metal wire which is excessively pressed in a conventional technique.

FIG. 13 A front view of a tip end portion 1 of a wedge tool according to an embodiment 2.

FIG. 14 An F-F cross-sectional view of the tip end portion 1 of the wedge tool according to the embodiment 2.

FIG. 15 A schematic appearance view of the metal wire 2 which is appropriately pressed according to the embodiment 2.

FIG. 16 A schematic appearance view of the metal wire 2 which is excessively pressed according to the embodiment 2.

FIG. 17 A front view of a tip end portion 1 of a wedge tool according to an embodiment 3.

FIG. 18 A G-G cross-sectional view of a tip end portion 1 of a wedge tool according to an embodiment 3.

FIG. 19 A schematic appearance view of a metal wire 2 which is appropriately pressed according to the embodiment 3.

FIG. 20 A schematic appearance view of the metal wire 2 which is excessively pressed according to the embodiment 3.

FIG. 21 A front view of a tip end portion 1 of a wedge tool according to an embodiment 4.

FIG. 22 An H-H cross-sectional view of the tip end portion 1 of the wedge tool according to the embodiment 4.

FIG. 23 A schematic appearance view of the metal wire 2 which is appropriately pressed according to the embodiment 4.

FIG. 24 A schematic appearance view of the metal wire 2 which is excessively pressed according to the embodiment 4.

DESCRIPTION OF EMBODIMENT(S)

A wedge tool and a method of manufacturing a semiconductor device according to embodiments of the present disclosure are described hereinafter with reference to the drawings. The same signs are assigned to constituent elements having the same or corresponding functions, and a repetitive description is omitted in some cases.

Embodiment 1

FIG. 1 illustrates a front view of a tip end portion 1 of a wedge tool according to an embodiment 1, and FIG. 2 illustrates a cross-sectional view of an A-A cross section in FIG. 1 of the tip end portion 1 of the wedge tool according to the embodiment 1. As illustrated in FIG. 1, a wire holding groove 3 concaved to hold a metal wire 2 is located in a tip end portion 1 of the wedge tool, and the wire holding groove 3 extends along a longitudinal direction of the metal wire 2, and includes a sidewall 4 and a groove bottom part 5. A columnar convex part 8 is provided to the groove bottom part 5, and a side surface of the columnar convex part 8 is located away from the sidewall 4. As illustrated in FIG. 2, in the present embodiment 1, three columnar convex parts 8 are provided side by side along the wire holding groove 3 extending in a longitudinal direction of the metal wire 2.

A height of the columnar convex part 8 is preferably within a range of $10\pm5\%$ of a diameter of the metal wire 2 which is to be used in order to prevent excessive force applied to the metal wire 2 and a bonded body by the columnar convex part 8, and when the diameter of the metal wire is 200 µm, for example, the height of the columnar convex part 8 is preferably within a range of $20\pm10$ µm. However, the diameter of the metal wire used in wedge bonding is generally approximately 50 µm to 600 µm, and is a design manner which should be selected in accordance with a product specification and product conditions, thus the height of the columnar convex part 8 is not limited thereto described above. The number of the columnar convex parts 8 provided to the groove bottom part 5 is three for a purpose of reliably preventing a recognition error from a viewpoint of usage for an appearance inspection, thus at least two or more columnar convex parts 8 are preferably provided.

Described are a case where the tip end portion 1 of the wedge tool appropriately presses the metal wire 2 and a case where the tip end portion 1 of the wedge tool excessively presses the metal wire 2 by performing wedge bonding using the wedge tool having such a configuration. FIG. 3 is a schematic appearance view of the metal wire 2 which is appropriately pressed according to the embodiment 1, and FIG. 4 is a schematic cross-sectional view of a B-B cross section in FIG. 3 of the metal wire 2 which is appropriately pressed according to the embodiment 1. In the configuration described in the embodiment 1, when the tip end portion 1 of the wedge tool appropriately presses the metal wire 2, the columnar convex part 8 slightly has contact with a surface of the metal wire 2, thus a contact mark is formed in the metal wire 2 with an arc-like surface deformed into a substantially planar shape as illustrated in FIG. 4. In the meanwhile, FIG. 5 is a schematic appearance view of the metal wire 2 which is excessively pressed according to the embodiment 1, and FIG. 6 is a schematic cross-sectional view of a C-C cross section in FIG. 5 of the metal wire 2 which is excessively pressed according to the embodiment 1. When the tip end portion 1 of the wedge tool according to the embodiment 1 excessively presses the metal wire 2, the columnar convex part 8 digs into the metal wire 2, thus as illustrated in FIG. 6, a contact mark 9 having a clear depth is formed in the metal wire 2. The side surface of the columnar convex part 8 is formed away from the sidewall 4 of the wire holding groove 3, thus a region where the metal wire 2 is deformed by contact of the sidewall 4 is not overlapped with the contact mark 9 formed by contact of the columnar convex part 8. That is to say, the contact mark 9 is formed in a reflection of only the shape of the columnar convex part 8.

A difference between a wedge tool according to a conventional technique and the wedge tool according to the present disclosure is described herein. FIG. 7 is a front view of a tip end portion of a wedge tool according to the conventional technique, and FIG. 8 is a side view of the tip end portion of the wedge tool according to the conventional technique. The wire holding groove 3 for holding the metal wire 2 is located in the tip end portion 1 of the wedge tool. The wire holding groove 3 extends along the longitudinal direction of the metal wire 2, includes the sidewall 4 and the groove bottom part 5, and does not include the columnar convex part 8 in the groove bottom part 5 such as that in a wedge tool described in the embodiment 1. When the metal wire 2 is bonded to a bonded body 6, as illustrated in FIG. 7, the sidewall 4 has contact with and sandwiches the metal wire 2 to hold the metal wire 2, and presses the tip end portion 1 of the wedge tool toward the bonded body 6. Furthermore, as illustrated in FIG. 8, ultrasonic vibration is applied to the metal wire 2 via the tip end portion 1 of the wedge tool to bond the metal wire 2 to the bonded body 6. A vibration direction 7 of the applied ultrasonic vibration is the longitudinal direction of the metal wire 2 as illustrated in FIG. 8.

Described next is an appearance of the metal wire 2 wedge-bonded by a wedge tool according to a conventional technique. FIG. 9 is a schematic appearance view of the metal wire 2 which is properly pressed in a conventional technique, and FIG. 10 is a schematic appearance view of the metal wire 2 which is excessively pressed in a conventional technique. When metal wire 2 is excessively pressed by the tip end portion 1 of the wedge tool, the metal wire 2 is widely deformed in a direction perpendicular to a direction in which the metal wire 2 is pressed, that is a diameter direction of the metal wire 2 compared with a case where the metal wire 2 is properly pressed, thus it is indicated that the metal wire 2 which is excessively pressed in FIG. 10 has a larger appearance width compared with the metal wire 2 which is properly pressed in FIG. 9.

FIG. 11 is a schematic cross-sectional view of a D-D cross section in FIG. 9 or the metal wire 2 which is properly pressed in a conventional technique, and FIG. 12 is a schematic cross-sectional view of an E-E cross section in FIG. 10 of the metal wire 2 which is excessively pressed in a conventional technique. As described above, FIG. 11 and FIG. 12 indicate that when the metal wire 2 is excessively pressed, the metal wire 2 is widely deformed in the direction perpendicular to the direction in which the metal wire 2 is pressed, that is the diameter direction of the metal wire 2 compared with the case where the metal wire 2 is properly pressed, thus cross-sectional shapes and thicknesses of end portions of the metal wires 2 which are pressed and deformed are different from each other. The difference of the cross-sectional shapes and the thicknesses of the end portions of the metal wires 2 causes variation of appearance of the appearance shape of the metal wire 2, thus it is indicated that usage of the appearance shape of the metal wire 2 may lead to reduction in inspection accuracy.

Accordingly, when the wedge tool according to the conventional technique is used, an index of the appearance inspection is only the appearance shape of the deformed metal wire 2, thus the variation occurs. However, when the wedge tool according to the embodiment 1 is used, at least two columnar convex parts 8 having the side surfaces away from the sidewall 4 are provided to the groove bottom part 5 of the wire holding groove 3, thus the independent contact mark 9 having the depth is formed when the tip end portion 1 of the wedge tool excessively presses the metal wire 2. As a result, when the wedge tool according to the embodiment 1 is used, it can be determined whether or not press force applied to the bonded body 6 is excessive according to the determination whether or not the contact mark 9 is formed in the metal wire 2 as the index. The appearance inspection can be performing using presence or absence of the contact mark 9 or the depth of the contact mark 9 as the index. Particularly, in a case where the image recognition is used, the recognition accuracy is improved when the wedge tool according to the embodiment 1 is used, thus an effect of suppressing the reduction of the inspection accuracy can be obtained compared with the conventional appearance inspection.

Described next is a method of manufacturing a semiconductor device using the wedge tool according to the embodiment 1. The method of manufacturing the semiconductor device according to the embodiment 1 includes: a step of pressing the metal wire 2 to the bonded body 6 by the tip end portion 1 of the wedge tool using the wedge tool described above as the embodiment 1; a step of applying ultrasonic vibration while the metal wire 2 is pressed; and a step of determining that the press force applied to the bonded body 6 is larger than the predetermined force when the contact mark 9 is formed in the metal wire 2 by the columnar convex part 8 in the step of pressing the metal wire 2, and determining that press force applied to the bonded body 6 is equal to or smaller than the predetermined force when the contact mark 9 is not formed in the metal wire 2.

When the method of manufacturing the semiconductor device having such a configuration is applied, it can be determined whether or not the press force applied to the bonded body 6 is excessive according to the determination whether or not the contact mark 9 is formed in the metal wire 2 as the index, thus the method of manufacturing the semiconductor device suppressing reduction of the inspection accuracy compared with the conventional appearance inspection can be provided.

Described is the other method as a method of manufacturing the semiconductor device using the wedge tool according to the embodiment 1. A method of manufacturing the semiconductor device using the wedge tool according to the embodiment 1 includes: a step of pressing the metal wire 2 to the bonded body 6 by the tip end portion 1 of the wedge tool using the wedge tool described above as the embodiment 1; a step of applying ultrasonic vibration while the metal wire 2 is pressed; and a step of determining appropriateness of the press force applied to the bonded body 6 in accordance with the depth of the contact mark 9 formed in the metal wire 2 by the columnar convex part 8 in the step of pressing the metal wire 2. For example, a range of the depth of the contact mark 9 formed in a case where appropriate press force is applied is previously set, and when the depth of the contact mark 9 formed in the metal wire 2 is smaller than a predetermined depth, it is determined that the press force is small. When the depth of the contact mark 9 formed in the metal wire 2 is within a predetermined range of depth, it is determined that the press force is appropriate. Furthermore, when the depth of the contact mark 9 formed in the metal wire 2 is larger than a predetermined range of depth, it is determined that the press force is large.

Applied is the method of manufacturing the semiconductor device determining appropriateness of the press force applied to the bonded body 6 in accordance with the depth of the contact mark 9 formed in the metal wire 2, thus appropriateness of the press force applied to the bonded body 6 can be determined using the depth of the contact mark 9 formed in the metal wire 2 as the index, and the method of manufacturing the semiconductor device suppressing reduction of the inspection accuracy compared with the conventional appearance inspection can be provided.

Embodiment 2

FIG. 13 is a front view of the tip end portion 1 of a wedge tool according to an embodiment 2, and FIG. 14 is a cross-sectional view of an F-F cross section in FIG. 13 of the tip end portion 1 of the wedge tool according to the embodiment 2. As illustrated in FIG. 13, the wire holding groove 3 for holding the metal wire 2 is located in the tip end portion 1 of the wedge tool, and the wire holding groove 3 extends along the longitudinal direction of the metal wire 2, and includes the sidewall 4 and the groove bottom part 5. The columnar convex part 8 is provided to the groove bottom part 5, and the side surface of the columnar convex part 8 is located away from the sidewall 4. In the wedge tool described in the embodiment 2, as illustrated in FIG. 14, three columnar convex parts 8 are provided away from each other side by side along the wire holding groove 3 extending in the longitudinal direction of the metal wire 2, and are made up in a combination with different heights.

A height of the columnar convex part 8 is preferably within a range of 10±5% of a diameter of the metal wire 2 which is to be used in order to prevent excessive force applied to the metal wire 2 and a bonded body by the columnar convex part 8, and when the diameter of the metal wire 2 is 200 μm, for example, the height of the columnar convex part 8 is preferably within a range of 20±10 μm. In the embodiment 2, two columnar convex parts 8 having a height of 10 μm and one columnar convex part 8 having a height of 30 μm constitute one combination as an example. However, the diameter of the metal wire 2 used in wedge bonding is generally approximately 50 μm to 600 μm, and is a design manner which should be selected in accordance with a product specification and product conditions, thus the height of the columnar convex part 8 is not limited thereto described above. The number of the columnar convex parts 8 provided to the groove bottom part 5 is three for a purpose of reliably preventing a recognition error from a viewpoint of usage for an appearance inspection, thus at least two or more columnar convex parts 8 are preferably provided.

Described are a case where the tip end portion 1 of the wedge tool appropriately presses the metal wire 2 and a case where the tip end portion 1 of the wedge tool excessively presses the metal wire 2 by performing wedge bonding using the wedge tool having such a configuration. FIG. 15 is a schematic appearance view of the metal wire 2 which is appropriately pressed according to the embodiment 2, and FIG. 16 is a schematic appearance view of the metal wire 2 which is excessively pressed according to the embodiment 2.

When the tip end portion 1 of the wedge tool according to the embodiment 2 appropriately presses the metal wire 2, the columnar convex part 8 having a larger height digs into the metal wire 2, and the columnar convex part 8 having a smaller height does not dig into the metal wire 2, thus as illustrated in FIG. 15, only one contact mark 9 having a depth is formed in the metal wire 2. In the meanwhile, when the tip end portion 1 of the wedge tool excessively presses the metal wire 2, two columnar convex parts 8 each having a smaller height dig into the metal wire 2 in addition to one columnar convex part 8 having a larger height, thus as illustrated in FIG. 16, three contact marks 9 each having a depth are formed in the metal wire 2. The columnar convex part 8 is formed away from the sidewall 4, thus a region where the metal wire 2 is deformed by contact of the sidewall 4 is not overlapped with the contact mark 9 formed by contact of the columnar convex part 8. That is to say, the contact mark 9 is formed in a reflection of only the shape of the columnar convex part 8.

Accordingly, when the wedge tool described in the embodiment 2 is used, at least two columnar convex parts 8 having different heights are provided away from each other in the groove bottom part 5 of the wire holding groove 3 away from the sidewall 4, thus when the tip end portion 1 of the wedge tool excessively presses the metal wire 2 compared with the case of pressing the metal wire 2 with the press force within the predetermined range, a large number of the independent contact marks 9 each having the a large depth are formed. As a result, the appearance inspection using the number of the contact marks 9 as the index can be performed, and the recognition accuracy is improved particularly when the image recognition is used, thus obtained is the effect of suppressing reduction of the inspection accuracy compared with the conventional appearance inspection.

In this embodiment 2, the wire holding groove 3 includes the columnar convex parts 8 having two types of height, but may include the columnar convex parts 8 having three or more types of height. When the wire holding groove 3 includes the columnar convex parts 8 having three or more types of height, force applied to the bonded body 6 can be presumed more accurately in the appearance inspection than the case where the wire holding groove 3 includes the columnar convex parts 8 having two types of height.

Described next is a method of manufacturing a semiconductor device using the wedge tool according to the embodiment 2. A method of manufacturing the semiconductor device using the wedge tool according to the embodiment 2 includes: a step of pressing the metal wire 2 to the bonded body 6 by the tip end portion 1 of the wedge tool using the wedge tool described above as the embodiment 2; a step of applying ultrasonic vibration while the metal wire 2 is pressed; and a step of determining appropriateness of the press force applied to the bonded body 6 in accordance with the number of the contact marks 9 formed in the metal wire 2 by the columnar convex part 8 in the step of pressing the metal wire 2. For example, a range of the number of the contact marks 9 formed in a case where appropriate press force is applied is previously set, and when the number of the contact marks 9 formed in the metal wire 2 is smaller than a predetermined depth, it is determined that the press force is small. When the number of the contact marks 9 formed in the metal wire 2 is within a predetermined range of number, it is determined that the press force is appropriate. Furthermore, when the number of the contact marks 9 formed in the metal wire 2 is larger than a predetermined range of number, it is determined that the press force is large.

As described above, applied is the method of manufacturing the semiconductor device determining appropriateness of the press force applied to the bonded body 6 in accordance with the number of the contact marks 9 formed in the metal wire 2, thus appropriateness of the press force applied to the bonded body 6 can be determined using the number of the contact marks 9 formed in the metal wire 2 as the index, and the method of manufacturing the semiconductor device suppressing reduction of the inspection accuracy compared with the conventional appearance inspection can be provided.

Embodiment 3

FIG. 17 is a front view of the tip end portion 1 of a wedge tool according to an embodiment 3, and FIG. 18 is a G-G cross-sectional view of the tip end portion 1 of the wedge tool according to the embodiment 3. The embodiment 3 has a configuration that the columnar convex part 8 provided to the groove bottom part 5 in the embodiment 2 is replaced with a conical convex part 10, and the other configuration is similar to that according to the embodiment 2. A shape of the convex part is the conical shape in the embodiment 3, however, it may be a polygonal pyramidal shape.

Wedge bonding is performed using the wedge tool having such as configuration, thus an action similar to that in the embodiment 2 can be obtained. Moreover, the conical convex part 10 is applied in place with the columnar convex part 8, thus the conical convex part 10 digs into the metal wire 2 more easily than the columnar convex part 8, and the contact mark 9 is formed more clearly. It is sufficient that the conical convex part 10 has a shape digging into the metal wire 2 more easily than the columnar convex part 8 to form the contact mark 9 more clearly, thus the shape of the conical convex part 10 may be the polygonal pyramidal shape. FIG. 19 is a schematic appearance view of the metal wire 2 which is appropriately pressed according to the embodiment 3, and FIG. 20 is a schematic appearance view of the metal wire 2 which is excessively pressed according to the embodiment 3.

Accordingly, when the wedge tool described in the embodiment 3 is used, the more clear contact mark 9 can be formed in the metal wire 2 by the conical convex part 10 in addition to the effect similar to that in the embodiment 2. As a result, when the wedge tool described in the embodiment 3 is used, visibility of the contact mark 9 is further improved, and the recognition accuracy is also improved particularly when the image recognition is used, thus obtained is an effect of further suppressing reduction of the inspection accuracy compared with the appearance inspection according to the embodiment 2.

Described next is a method of manufacturing a semiconductor device using the wedge tool according to the embodiment 3. A method of manufacturing the semiconductor device using the wedge tool according to the embodiment 3 includes: a step of pressing the metal wire 2 to the bonded body 6 by the tip end portion 1 of the wedge tool using the wedge tool described above as the embodiment 3; a step of applying ultrasonic vibration while the metal wire 2 is pressed; and a step of determining appropriateness of the press force applied to the bonded body 6 in accordance with the number of the contact marks 9 formed in the metal wire 2 by the conical convex part 10 in the step of pressing the metal wire 2.

When the method of manufacturing the semiconductor device having such a configuration is applied, the more clear contact mark 9 can be formed in the metal wire 2 by the conical convex part 10 in the embodiment 3 in addition to the effect similar to that in the embodiment 2. As a result, visibility of the contact mark 9 is further improved, and the recognition accuracy is also improved particularly when the image recognition is used, thus the method of manufacturing the semiconductor device further suppressing reduction of the inspection accuracy of the appearance inspection compared with the method of manufacturing the semiconductor device described in the embodiment 2 can be provided.

Embodiment 4

FIG. 21 is a front view of the tip end portion 1 of a wedge tool according to an embodiment 4, and FIG. 22 is a cross-sectional view of an H-H cross section in FIG. 21 of the tip end portion 1 of the wedge tool according to the embodiment 4. The embodiment 4 is different from the embodiment 2 in that the columnar convex part 8 provided to the groove bottom part 5 is a convex part 11, the convex part 11 includes a first convex part, a second convex part, a third convex part, and a fourth convex part integrally formed in the longitudinal direction of the metal wire, and heights of the first convex part, the second convex part, the third convex part, and the fourth convex part from the groove bottom part 5 are different from each other. The other configuration is similar to that in the embodiment 2. In the embodiment 4, the first convex part, the second convex part, the third convex part, and the fourth convex part are formed so that the heights thereof decrease in this order. The plurality of convex parts are integrally formed in the convex part 11, thus it is sufficient that at least one convex part 11 is provided.

Described are a case where the tip end portion 1 of the wedge tool appropriately presses the metal wire 2 and a case where the tip end portion 1 of the wedge tool excessively presses the metal wire 2 by performing wedge bonding using the wedge tool having such a configuration. FIG. 23 is a schematic appearance view of the metal wire 2 which is appropriately pressed according to the embodiment 4, and FIG. 24 is a schematic appearance view of the metal wire 2 which is excessively pressed according to the embodiment 4.

When the tip end portion 1 of the wedge tool appropriately presses the metal wire 2 in the configuration described in the embodiment 4, the first convex part having a larger height from the groove bottom part 5 digs into the metal wire 2, and the second convex part, the third convex part, and the fourth convex part each having a smaller height from the groove bottom part 5 than the first convex part do not dig into the metal wire 2, thus as illustrated in FIG. 23, the contact mark 9 having a length corresponding to the first convex part in the longitudinal direction of the metal wire 2 is formed in the metal wire 2. In the meanwhile, when the tip end portion 1 of the wedge tool excessively presses the metal wire 2, the first convex part, the second convex part, the third convex part, and the fourth convex part dig into the metal wire 2, thus as illustrated in FIG. 24, the contact mark 9 having a length including the first convex part, the second convex part, the third convex part, and the fourth convex part in the longitudinal direction of the metal wire 2 is formed in the metal wire 2. The side surface of the convex part 11 is formed away from the sidewall 4, thus a region where the metal wire 2 is deformed by contact of the sidewall 4 is not overlapped with the contact mark 9 formed by contact of the convex part 11. That is to say, the contact mark 9 is formed in a reflection of only the shape of the convex part 11.

Accordingly, when the wedge tool described in the embodiment 4 is used, at least two convex parts integrally formed so that the side surfaces are located away from the sidewall 4 in the longitudinal direction of the metal wire are located in the groove bottom part 5 of the wire holding groove 3, and the convex parts 11 having heights from the groove bottom part 5 of the convex parts different from each other is provided, thus when the tip end portion 1 of the wedge tool excessively presses the metal wire 2 compared with the case of pressing the metal wire 2 with press force within the predetermined range, the contact mark 9 is formed to have a large length in the longitudinal direction of the metal wire 2. As a result, the appearance inspection using the length of the contact mark 9 in the longitudinal direction of the metal wire 2 as the index can be performed, and the recognition accuracy is improved particularly when the image recognition is used, thus obtained is the effect of suppressing reduction of the inspection accuracy compared with the conventional appearance inspection.

In this embodiment 4, the convex part 11 includes the first convex part, the second convex part, the third convex part, and the fourth convex part, however, also applicable is a configuration including at least two convex parts. As the number of the convex parts constituting the convex part 11 gets large, the force applied to the bonded body 6 can be presumed more accurately in the appearance inspection.

Described next is a method of manufacturing a semiconductor device using the wedge tool according to the embodiment 4. A method of manufacturing the semiconductor device using the wedge tool according to the embodiment 4 includes: a step of pressing the metal wire 2 to the bonded body 6 using the wedge tool described above as the embodiment 4; a step of applying ultrasonic vibration while the metal wire 2 is pressed; and a step of determining appropriateness of the press force applied to the bonded body 6 in accordance with the length of the contact mark 9 formed in the metal wire 2 in the length direction of the metal wire 2 by the convex part 11 in the step of pressing the metal wire 2. For example, a range of the length of the contact mark 9 in the longitudinal direction of the metal wire 2 formed in a case where appropriate press force is applied is previously set, and when the length of the contact mark 9 formed in the metal wire 2 in the longitudinal direction of the metal wire 2 is smaller than a predetermined length, it is determined that the press force is small. When the length of the contact mark 9 formed in the metal wire 2 in the longitudinal direction of the metal wire 2 is within a predetermined range of length, it is determined that the press force is appropriate. Furthermore, when the length of the contact mark 9 formed in the metal wire 2 in the longitudinal direction of the metal wire 2 is larger than a predetermined range of length, it is determined that the press force is large.

Applied is the method of manufacturing the semiconductor device determining appropriateness of the press force applied to the bonded body 6 in accordance with the length of the contact mark 9 formed in the metal wire 2 in the longitudinal direction of the metal wire 2, thus appropriateness of the press force applied to the bonded body 6 can be determined using the length of the contact mark 9 formed in the metal wire 2 in the longitudinal direction of the metal wire 2 as the index, and the method of manufacturing the semiconductor device suppressing reduction of the inspection accuracy compared with the conventional appearance inspection can be provided.

Each embodiment disclosed in the present specification can be arbitrarily combined, or each embodiment can be appropriately varied or omitted within a scope of the present disclosure.

EXPLANATION OF REFERENCE SIGNS

1 tip end portion of wedge tool
2 metal wire
3 wire holding groove

4 sidewall
5 groove bottom part
6 bonded body
7 vibration direction of ultrasonic vibration
8 columnar convex part
9 contact mark
10 conical convex part
11 convex part

The invention claimed is:

1. A wedge tool used for wedge bonding of pressing a metal wire and applying ultrasonic vibration, thereby bonding the metal wire to a bonded body, comprising:
   a wire holding groove extending along a longitudinal direction of the metal wire in a tip end portion of the wedge tool and holding the metal wire, the wire holding groove including a groove bottom part and opposite sidewalls extending from a lowermost point of the groove bottom part; and
   at least two columnar convex parts formed in the groove bottom part of the wire holding groove and each having a perimeter vertically extending from the opposite sidewalls of the wire holding groove with opposite outermost side surfaces located away from the opposite sidewalls of the wire holding groove and arranged in the longitudinal direction of the metal wire,
   each of the at least two columnar convex parts straddles the lowermost point of the groove bottom part, and
   each of the opposite outermost side surfaces begins in contact with a respective one of the opposite sidewalls of the wire holding groove and extends outward from the respective one of the opposite sidewalls to a distal end of the columnar convex part.

2. A wedge tool used for wedge bonding of pressing a metal wire and applying ultrasonic vibration, thereby bonding the metal wire to a bonded body, comprising:
   a wire holding groove extending along a longitudinal direction of the metal wire in a tip end portion of the wedge tool and holding the metal wire, the wire holding groove including a groove bottom part and opposite sidewalls extending from a lowermost point of the groove bottom part; and
   columnar convex parts formed in the groove bottom part of the wire holding groove and having heights from the groove bottom part different from each other, and each of the columnar convex parts having a perimeter vertically extending from the opposite sidewalls of the wire holding groove and including a distal portion having opposite outermost side surfaces located away from the opposite sidewalls of the wire holding groove,
   each of the columnar convex parts straddles the lowermost point of the groove bottom part, and
   each of the opposite outermost side surfaces begins in contact with a respective one of the opposite sidewalls of the wire holding groove and extends outward from the respective one of the opposite sidewalls to a distal end of the columnar convex part.

3. The wedge tool according to claim 2, wherein the columnar convex part includes a first columnar convex part and a second columnar convex part formed away from each other side by side along a longitudinal direction of the metal wire, and the first columnar convex part and the second columnar convex part have lengths from the groove bottom part different from each other.

4. The wedge tool according to claim 2, wherein the columnar convex part includes a first columnar convex part and a second columnar convex part integrally formed in a longitudinal direction of the metal wire, and the first columnar convex part and the second columnar convex part have lengths from the groove bottom part different from each other.

5. The wedge tool according to claim 1, wherein a height of the columnar convex part which is largest from the groove bottom part is within a range of 10±5% of a diameter of the metal wire.

6. A method of manufacturing a semiconductor device bonding a metal wire and a bonded body, comprising:
   a step of pressing the metal wire to the bonded body using the wedge tool according to claim 1;
   a step of applying ultrasonic vibration while the metal wire is pressed; and
   a step of determining whether press force applied to the bonded body is larger than predetermined force by determining whether or not a contact mark is formed in the metal wire by the columnar convex part in the step of pressing the metal wire.

7. A method of manufacturing a semiconductor device bonding a metal wire and a bonded body, comprising:
   a step of pressing the metal wire to the bonded body using the wedge tool according to claim 1;
   a step of applying ultrasonic vibration while the metal wire is pressed; and
   a step of determining appropriateness of press force applied to the bonded body in accordance with a depth of a contact mark formed in the metal wire by the columnar convex part in the step of pressing the metal wire.

8. A method of manufacturing a semiconductor device bonding a metal wire and a bonded body, comprising:
   a step of pressing the metal wire to the bonded body using the wedge tool according to claim 1;
   a step of applying ultrasonic vibration while the metal wire is pressed; and
   a step of determining appropriateness of press force applied to the bonded body in accordance with a total number of contact marks formed in the metal wire by the columnar convex part in the step of pressing the metal wire.

9. A method of manufacturing a semiconductor device bonding a metal wire and a bonded body, comprising:
   a step of pressing the metal wire to the bonded body using the wedge tool according to claim 4;
   a step of applying ultrasonic vibration while the metal wire is pressed; and
   a step of determining appropriateness of press force applied to the bonded body in accordance with a length of a contact mark formed in the metal wire in a longitudinal direction of the metal wire by the columnar convex part in the step of pressing the metal wire.

10. The wedge tool according to claim 2, wherein a height of the columnar convex part which is largest from the groove bottom part is within a range of 10±5% of a diameter of the metal wire.

11. A method of manufacturing a semiconductor device bonding a metal wire and a bonded body, comprising:
   a step of pressing the metal wire to the bonded body using the wedge tool according to claim 2;
   a step of applying ultrasonic vibration while the metal wire is pressed; and
   a step of determining whether press force applied to the bonded body is larger than predetermined force by determining whether or not a contact mark is formed in the metal wire by the columnar convex part in the step of pressing the metal wire.

12. A method of manufacturing a semiconductor device bonding a metal wire and a bonded body, comprising:
   a step of pressing the metal wire to the bonded body using the wedge tool according to claim 2;
   a step of applying ultrasonic vibration while the metal wire is pressed; and
   a step of determining appropriateness of press force applied to the bonded body in accordance with a depth of a contact mark formed in the metal wire by the columnar convex part in the step of pressing the metal wire.

13. A method of manufacturing a semiconductor device bonding a metal wire and a bonded body, comprising:
   a step of pressing the metal wire to the bonded body using the wedge tool according to claim 3;
   a step of applying ultrasonic vibration while the metal wire is pressed; and
   a step of determining appropriateness of press force applied to the bonded body in accordance with a total number of contact marks formed in the metal wire by the columnar convex part in the step of pressing the metal wire.

14. A method of manufacturing a semiconductor device bonding a metal wire and a bonded body, comprising:
   a step of pressing the metal wire to the bonded body using a wedge tool, the wedge tool comprising:
      a wire holding groove extending along a longitudinal direction of the metal wire in a tip end portion of the wedge tool and holding the metal wire; and
      at least two convex parts formed in a groove bottom part of the wire holding groove and each having a side surface located away from a sidewall of the wire holding groove and arranged in the longitudinal direction of the metal wire;
   a step of applying ultrasonic vibration while the metal wire is pressed; and
   a step of determining whether press force applied to the bonded body is larger than predetermined force by determining whether or not a contact mark is formed in the metal wire by the convex part in the step of pressing the metal wire.

15. A method of manufacturing a semiconductor device bonding a metal wire and a bonded body, comprising:
   a step of pressing the metal wire to the bonded body using a wedge tool, the wedge tool comprising:
      a wire holding groove extending along a longitudinal direction of the metal wire in a tip end portion of the wedge tool and holding the metal wire; and
      at least two convex parts formed in a groove bottom part of the wire holding groove and each having a side surface located away from a sidewall of the wire holding groove and arranged in the longitudinal direction of the metal wire;
   a step of applying ultrasonic vibration while the metal wire is pressed; and
   a step of determining appropriateness of press force applied to the bonded body in accordance with a depth of a contact mark formed in the metal wire by the convex part in the step of pressing the metal wire.

16. A method of manufacturing a semiconductor device bonding a metal wire and a bonded body, comprising:
   a step of pressing the metal wire to the bonded body using a wedge tool, the wedge tool comprising:
      a wire holding groove extending along a longitudinal direction of the metal wire in a tip end portion of the wedge tool and holding the metal wire; and at least two convex parts formed in a groove bottom part of the wire holding groove and each having a side surface located away from a sidewall of the wire holding groove and arranged in the longitudinal direction of the metal wire;

a step of applying ultrasonic vibration while the metal wire is pressed; and a step of determining appropriateness of press force applied to the bonded body in accordance with a total number of contact marks formed in the metal wire by the convex part in the step of pressing the metal wire.

17. A method of manufacturing a semiconductor device bonding a metal wire and a bonded body, comprising:

a step of pressing the metal wire to the bonded body using a wedge tool, the wedge tool comprising:

a wire holding groove extending along a longitudinal direction of the metal wire in a tip end portion of the wedge tool and holding the metal wire; and convex parts formed in a groove bottom part of the wire holding groove and having heights from the groove bottom part different from each other, wherein the convex part includes a first convex part and a second convex part integrally formed in a longitudinal direction of the metal wire, and the first convex part and the second convex part have lengths from the groove bottom part different from each other;

a step of applying ultrasonic vibration while the metal wire is pressed; and a step of determining appropriateness of press force applied to the bonded body in accordance with a length of a contact mark formed in the metal wire in a longitudinal direction of the metal wire by the convex part in the step of pressing the metal wire.

18. A method of manufacturing a semiconductor device bonding a metal wire and a bonded body, comprising:

a step of pressing the metal wire to the bonded body using a wedge tool, the wedge tool comprising:

a wire holding groove extending along a longitudinal direction of the metal wire in a tip end portion of the wedge tool and holding the metal wire; and convex parts formed in a groove bottom part of the wire holding groove and having heights from the groove bottom part different from each other;

a step of applying ultrasonic vibration while the metal wire is pressed; and a step of determining whether press force applied to the bonded body is larger than predetermined force by determining whether or not a contact mark is formed in the metal wire by the convex part in the step of pressing the metal wire.

19. A method of manufacturing a semiconductor device bonding a metal wire and a bonded body, comprising:

a step of pressing the metal wire to the bonded body using a wedge tool, the wedge tool comprising:

a wire holding groove extending along a longitudinal direction of the metal wire in a tip end portion of the wedge tool and holding the metal wire; and convex parts formed in a groove bottom part of the wire holding groove and having heights from the groove bottom part different from each other;

a step of applying ultrasonic vibration while the metal wire is pressed; and a step of determining appropriateness of press force applied to the bonded body in accordance with a depth of a contact mark formed in the metal wire by the convex part in the step of pressing the metal wire.

* * * * *